(12) United States Patent
Libby et al.

(10) Patent No.: US 6,486,478 B1
(45) Date of Patent: Nov. 26, 2002

(54) GAS CLUSTER ION BEAM SMOOTHER APPARATUS

(75) Inventors: Bruce K. Libby, Groveland, MA (US); Isao Yamada, Hyogo (JP); James A. Greer, Andover, MA (US); Lester G. Crawford, Boxford, MA (US); James G. Bachand, Georgetown, MA (US); Matthew C. Gwinn, Salem, MA (US); Richard P. Torti, Burlington, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/731,688

(22) Filed: Dec. 6, 2000

Related U.S. Application Data

(60) Provisional application No. 60/169,164, filed on Dec. 6, 1999.

(51) Int. Cl.[7] .............................. A61N 5/00; G21G 5/00; G21K 5/10; H01J 37/08; G30B 33/12
(52) U.S. Cl. ............................ 250/492.1; 250/492.2; 250/492.22; 204/192.1
(58) Field of Search ....................... 250/492.1, 492.2, 250/492.22; 204/192.1

(56) References Cited

U.S. PATENT DOCUMENTS 5,814,194 A 9/1998 Deguchi et al. ......... 204/192.1

FOREIGN PATENT DOCUMENTS

JP 08120470 5/1996

OTHER PUBLICATIONS

Shoaib Ahmad, Tasneem Riffat;, "A Cust Field, Hollow Cathode, Carbon Cluster Ion Source"; Feb. 16, 1999; Nuclear Instruments and Methods in Physics Research B 152 (1999); pp. 506–514.

Primary Examiner—John R. Lee
Assistant Examiner—David A. Vanore
(74) Attorney, Agent, or Firm—Perkins, Smith & Cohen, LLP; Jerry Cohen; Michelle J. Burke

(57) ABSTRACT

An apparatus for smoothing a surface of a substrate includes an ionizer to form gas cluster particles; a power supply to accelerate the gas cluster particles; a triode/Einzel lens combination assembly to focus the accelerated gas cluster particles; a permanent magnet beam filter; scan plates to irradiate the filtered accelerated gas cluster particles onto a surface of a workpiece situated in a reduced pressure atmosphere chamber; and a substrate loading/unloading mechanism to load and unload the workpiece. The ionizer includes an alignment device wherein the alignment device includes a X/Y translation element and an angular translation element. The substrate loading/unloading mechanism provides a workpiece from a plurality of workpieces onto a holder positioned at a first position within the reduced pressure atmosphere chamber, the first position being substantially parallel to a central axis of a flow of the filtered accelerated gas cluster particles. The substrate loading/unloading mechanism also moves the holder with a workpiece thereon to a second position, the second position being substantially perpendicular to the first position and the central axis of a flow of the filtered accelerated gas cluster particles.

21 Claims, 13 Drawing Sheets

| BORE | XY TRAVEL | CLEARANE |
|------|-----------|----------|
| 1.50 | ±0.50 | 3.00 |
| 2.50 | ±0.50 | 3.78 |
| 2.50 | ±1.00 | 4.90 |
| 4.00 | ±0.50 | 4.50 |
| 4.00 | ±1.00 | 5.63 |

GAS CLUSTER ION BEAM SMOOTHER APPARATUS

PRIORITY INFORMATION

This application claims priority from provisional application Ser. No. 60/169,164 filed Dec. 6, 1999.

FIELD OF THE PRESENT INVENTION

The present invention is directed to a gas cluster ion beam apparatus. More particularly, the present invention is directed to a gas cluster ion beam apparatus that enables effective separation of monomer or molecular ions from the gas cluster ion beam.

Moreover, the present invention is directed to a gas cluster ion beam apparatus capable of controlling multiple independent adjustments through an automated electronic control system.

BACKGROUND OF THE PRESENT INVENTION

Energetic-ion sputtering has been conventionally used for etching and thinning in manufacturing and depth-profiling in analytic instruments. However, energetic-ion sputtering causes subsurface damage and accumulated roughness because energetic-ion sputtering uses monomer ions. Individual monomer atoms or molecules have energies on the order of thousands of electron volts that cause the residual surface damage.

To avoid the residual surface damage, gas cluster ion beam process devices have been developed. One example of such an apparatus, as well as the creation and acceleration of such a conventional gas cluster ion beam, is described in U.S. Pat. No. 5,814,194 to Deguchi et al. The entire contents of U.S. Pat. No. 5,814,194 are hereby incorporated by reference. Another example of a gas cluster ion beam apparatus is described in U.S. Pat. No. 5,459,326 to Yamada. The entire contents of U.S. Pat. No. 5,459,326 are hereby incorporated by reference.

Gas cluster ion beams can be used for etching, cleaning, and smoothing of material surfaces in certain applications. These conventional gas cluster ion beams comprise gas clusters having nano-sized aggregates of materials that are gaseous under conditions of standard temperature and pressure. Such clusters are typically formed of aggregates of approximately 20 to approximately several thousand atoms or molecules loosely bound together. The gas clusters can be ionized by electron bombardment or other means, permitting the gas clusters to be formed into directed beams of known and controllable energy. The larger sized gas clusters are the most useful because the larger sized gas clusters are able to carry substantial energy per cluster ion, while yet having only modest energy per atom or molecule.

The gas clusters disintegrate on impact with each individual atom or molecule carrying only a small fraction of the total cluster energy. Consequently, the impact effects of large clusters, while substantial, are limited to only a very shallow surface region, thereby enabling ion clusters to be effective for a variety of surface modification processes, without the tendency to produce deeper subsurface damage. As noted above, deeper subsurface damage is a characteristic of monomer or molecular ion beam processing.

One characteristic of gas cluster ion interactions with surfaces is ultra-shallow interaction depth. The gas cluster ion interactions also exhibit inherent smoothing and planarization behaviors. These behaviors can be extraordinary when the gas cluster ion impacts upon rough or non-planar surfaces. Since the atoms within a cluster are able to interact with each other as the cluster disintegrates upon impact, some of the energy carried by the cluster is converted into energy of individual atoms within the cluster. This converted energy is dissipated in all directions within the plane of the target surface, thereby producing excellent smoothing behavior on most materials, including diamond. Lastly, the gas cluster ion interactions demonstrate an ability to produce enhanced surface chemical reactions with reactive cluster species.

Gas cluster ions deposit their total energy into the impact site upon the target surface. The atoms within a gas cluster ion have small individual energies that prevent the atoms from penetrating beyond very shallow depths of a few atomic layers. Consequently, a gas cluster ion deposits considerable energy into a much shallower region on the target surface than would a monomer or molecular ion of equal energy. Similarly, since the gas cluster ion has much greater mass and momentum, a gas cluster ion impact can generate much more intense pressure pulse effects than those associated with monomer ion bombardment.

Computer simulations of gas cluster ion impacts predict peak momentary temperatures of the order of 100,000°K in combination with pressure pulses in the range of millions of pounds per square inch. These transient high temperature and pressure conditions within the impact volume occur while the gas atoms from the cluster are being dynamically mixed with the target material atoms, thereby enabling highly enhanced chemical reaction properties to be observed or realized.

Conventionally, gas cluster ion sources produce gas clusters ions having a wide distribution of sizes, N (where N=the number atoms or molecules in each cluster). Such atoms in a cluster are not individually energetic enough (on the order of a few electron volts) to significantly penetrate a surface to cause the residual surface damage typically associated with the other types of ion beam processing, such as energetic-ion sputtering.

However, the gas cluster ion can be made sufficiently energetic (some thousands of electron volts), to effectively etch, smooth or clean surfaces. This allows the gas cluster ion to be used to smooth surfaces of various materials to nearly an atomic scale by utilizing all-dry vacuum methods. Such materials include, but are not limited to, silicon, compound semiconductors, dielectric wafers, films and high-dielectrics, thin metal and ferromagnetic films, and electro-optics.

An example of a prior art gas cluster ion beam apparatus 100 is illustrated in FIG. 1. As illustrated in FIG. 1, the gas cluster ion beam apparatus 100 includes a vacuum vessel 102 that is divided into three communicating chambers, a source chamber 104, a ionization/acceleration chamber 106, and a processing chamber 108. The three chambers are evacuated to suitable operating pressures by vacuum pumping systems 146a, 146b, and 146c, respectively. A condensable source gas 112 (for example argon, Ar) is admitted under pressure through gas feed tube 114 to stagnation chamber 116 and is ejected into the substantially lower pressure vacuum through a properly shaped nozzle 110.

The gas feed tube 114, the stagnation chamber 116, and the nozzle 110 together constitute the gas feed assembly, thereby producing a supersonic gas jet 118. Cooling, resulting from the expansion in the jet, causes a portion of the gas jet 118 to condense into clusters, each cluster consisting of from several to several thousand weakly bound atoms or molecules.

In FIG. 1, a gas skimmer 120, having an aperture, separates the gas products that have not been formed into a cluster jet from the cluster jet. This separation minimizes the pressure in the downstream regions where higher pressures would be detrimental (e.g., ionizer 122, high voltage electrodes 126, and process chamber 108). Suitable condensable source gases 112 include, but are not necessarily limited to, argon; nitrogen and other inert gases; oxygen; carbon dioxide; oxides of nitrogen; and sulfur hexafluoride.

After the supersonic gas jet 118 containing gas clusters has been formed, the clusters are ionized in ionizer 122. The ionizer 122 is typically an electron impact ionizer that produces thermoelectrons from one or more incandescent filaments 124. The ionizer 122 accelerates and directs the electrons causing the electrons to collide with the gas clusters in the gas jet 118, at the point where the jet passes through the ionizer 122. The impact of the electrons causes electrons from the clusters to be ejected, thereby causing a portion of the clusters to become positively ionized. The positive ionization is usually, but not necessarily, with a single charge.

A set of suitably biased high voltage electrodes 126 extracts the cluster ions from the ionizer, forming a beam. The biased high voltage electrodes 126 then accelerates the cluster ions to a desired energy (typically adjustable from 1 keV to several tens of keV) and focuses the cluster ions to form a gas cluster ion beam 128.

Filament power supply 136 provides voltage $V_F$ to heat the ionizer filament 124. Anode power supply 134 provides voltage $V_A$ to accelerate thermoelectrons emitted from filament 124 to cause the thermoelectrons to bombard the cluster containing gas jet 118 to produce ions. Extraction power supply 138 provides voltage $V_E$ to bias a high voltage electrode to extract ions from the ionizing region of the ionizer 122 and to form the gas cluster ion beam 128. Accelerator power supply 140 provides voltage $V_{Acc}$ to bias a high voltage electrode with respect to the ionizer 122 so as to result in a total gas cluster ion beam acceleration energy equal to $V_{Acc}$. One or more lens power supplies, 142 and 144, bias high voltage electrodes with potentials, $V_{L1}$ and $L_2$, to focus the gas cluster ion beam 128.

A workpiece 152, which may be a semiconductor wafer or other workpiece to be processed by gas cluster ion beam 128, is held on a workpiece holder 150, disposed in the path of the gas cluster ion beam 128. Since most applications contemplate the processing of large workpieces with spatially uniform results, a scanning system is desirable to uniformly scan the gas cluster ion beam 128 across large areas to produce spatially homogeneous results.

Two pairs of orthogonally oriented electrostatic scan plates 130 and 132 are utilized to produce a raster or other scanning pattern across the desired processing area. When beam scanning is performed, the gas cluster ion beam 128 is converted into a conical scanned gas cluster ion beam 148, which scans the entire surface of workpiece 152.

The core of this technology is predicated on the efficient generation, ionization, and controlled transport of a gas cluster ion beam 128 made up of clusters of gaseous ions to the surface of a workpiece 152 to be modified. A stream of pure gas, for example argon, is introduced into a vacuum environment through a modified Laval nozzle 118. The modified Laval nozzle 118 has a very small throat aperture and expands causing the gas to form large molecular clusters which exit the horn of the nozzle 118 in a concentrated core stream surrounded by a more diffuse cloud of monomer atoms or molecules.

The gas jet 118 has a central core of gas clusters, which is the useful portion of the gas stream and must be separated from the balance of the non-clustered gas atoms or molecules. This is done by directing the gas jet 118 through the small aperture of a gas skimmer 120 that passes the core cluster beam into a high vacuum ionization/acceleration chamber 106. The small aperture of a gas skimmer 120 skims the non-clustered gas molecules to be pumped away. This beam of gas clusters is then passed through an array of high voltage electrodes 126, exiting as a fully formed gas cluster ion beam 128, to be used in the aforementioned processing applications.

Considering the variety of potential production applications in the semiconductor and in other industries, there is great need for a gas cluster ion beam processing equipment that is compatible with the low maintenance, high production requirements of such industries. There have been several problems with conventional gas cluster ion beam equipment, which has primarily been designed for and used in laboratory or research environments. These problems have heretofore hindered the successful application of gas cluster ion beam processing in high volume industries.

One example of a problem with the conventional gas cluster ion beam equipment is that the conventional gas cluster ion beam equipment lacks a simple, inexpensive, and reliable means for separating monomer (or in the case of molecular gases, molecular) ions from the gas cluster ion beam. As noted above the inclusion of the monomer ions in the gas cluster ion beam can cause unwanted surface damage to the substrate being processed.

Moreover, the conventional gas cluster ion beam apparatus lacks efficient and automatic means for sequentially handling workpieces to move the workpieces into and out of the vacuum processing environment. This is important in a production environment as opposed to a research or laboratory environment. If the workpiece cannot be handled efficiently, the productivity of the gas cluster ion beam apparatus is negatively impacted.

Lastly, conventional gas cluster ion beam apparatus have no effective and fast means for aligning the neutral cluster jet produced by the nozzle with the aperture of the gas skimmer. Aligning the nozzle/gas skimmer assembly so that the beam exiting the nozzle is centered on the skimmer aperture and normal to and centered in the discs of the high voltage electrodes assembly is critical. Also since the ion beam is somewhat divergent as it leaves the nozzle, it is essential to have the correct spacing between the nozzle exit and the gas skimmer entrance. If this spacing is too large many of the clusters at the outer perimeter of the beam will be clipped away by the skimmer causing a loss of cluster beam throughput and an overall loss of performance.

Thus, it is an object of the present invention to provide an automated electronic control system capable of controlling the multiple independent adjustments of the gas cluster ion beam apparatus under programmable control to permit quick and efficient setup of a pre-selected beam condition and to maintain that condition during processing and to manage the sequential processing of multiple workpieces.

Another object of the present invention is to provide a simple, effective, reliable and inexpensive means for removing monomer or molecular ions from the gas cluster ion beam.

It is a further object of the present invention to provide automatically controllable endstation means for transferring workpieces to be processed into and out of the processing chamber for rapid, efficient production flow of workpieces through the gas cluster ion beam processor.

It is a still further object of the present invention to provide improved means for adjustable alignment of nozzle and gas skimmer to optimize gas cluster ion beam production. It is an objective that the alignment is accurate and repeatable and that the adjustments are fast and simple.

The present invention provides a solution to the problems set forth above with respect to the conventional gas cluster ion beam apparatus.

SUMMARY OF THE PRESENT INVENTION

One aspect of the present invention is a substrate surface treatment method. The method forms gas cluster particles comprising a plurality of atoms or molecules; accelerates the gas cluster particles; filters accelerated gas cluster particles using a permanent magnet beam filter; and irradiates the accelerated magnetically selected gas cluster particles onto a surface of a substrate in a reduced pressure atmosphere.

A second aspect of the present invention is a substrate surface treatment apparatus. The apparatus includes an ionizer to form gas cluster particles comprising a plurality of atoms or molecules; a power supply to accelerate the gas cluster particles; a permanent magnet beam filter to select certain accelerated gas cluster particles; and scan plates to irradiate the magnetically filtered accelerated gas cluster particles onto a surface of a substrate in a reduced pressure atmosphere.

A third aspect of the present invention is a substrate surface treatment method. The method forms gas cluster particles comprising a plurality of atoms or molecules; accelerates the gas cluster particles; focuses the accelerated gas cluster particles using a lens combination to realize a long focal length; and irradiates the accelerated magnetically selected gas cluster particles onto a surface of a substrate in a reduced pressure atmosphere.

A fourth aspect of the present invention is a substrate surface treatment apparatus. The apparatus includes an ionizer to form gas cluster particles comprising a plurality of atoms or molecules; a power supply to accelerate the gas cluster particles; a lens combination to focus the accelerated gas cluster particles to realize a long focal length; and scan plates to irradiate the magnetically filtered accelerated gas cluster particles onto a surface of a substrate in a reduced pressure atmosphere.

A fifth aspect of the present invention is an apparatus for smoothing a surface of a substrate. The apparatus includes an ionizer to form gas cluster particles comprising a plurality of atoms or molecules; a power supply to accelerate the gas cluster particles; a lens assembly to focus the accelerated gas cluster particles; a filter to filter the focussed gas cluster particles; scan plates to irradiate the filtered accelerated gas cluster particles onto a surface of a workpiece situated in a reduced pressure atmosphere chamber; and a substrate loading/unloading mechanism to load and unload the workpiece. The substrate loading/unloading mechanism provides a workpiece from a plurality of workpieces onto a holder positioned at a first position within the reduced pressure atmosphere chamber, the first position being substantially parallel to a central axis of a flow of the filtered accelerated gas cluster particles. The substrate loading/unloading mechanism also moves the holder with a workpiece thereon to a second position, the second position being substantially perpendicular to the first position and the central axis of a flow of the filtered accelerated gas cluster particles.

A sixth aspect of the present invention is an apparatus for smoothing a surface of a substrate. The apparatus includes an ionizer to form gas cluster particles comprising a plurality of atoms or molecules; a power supply to accelerate the gas cluster particles; a lens assembly to focus the accelerated gas cluster particles; a filter to filter the focussed gas cluster particles; scan plates to irradiate the filtered accelerated gas cluster particles onto a surface of a workpiece situated in a reduced pressure atmosphere chamber; and a substrate loading/unloading mechanism to load and unload the workpiece. The ionizer includes an alignment device wherein the alignment device includes a X/Y translation element having micrometer driving heads with opposing return spring assemblies and an angular translation element having micrometer driving heads with opposing return spring assemblies.

A seventh aspect of the present invention is an apparatus for smoothing a surface of a substrate. The apparatus includes an ionizer to form gas cluster particles comprising a plurality of atoms or molecules; a power supply to accelerate the gas cluster particles; a triode/Einzel lens combination assembly to focus the accelerated gas cluster particles; a permanent magnet beam filter to filter the focussed gas cluster particles; scan plates to irradiate the filtered accelerated gas cluster particles onto a surface of a workpiece situated in a reduced pressure atmosphere chamber; and a substrate loading/unloading mechanism to load and unload the workpiece. The ionizer includes an alignment device wherein the alignment device includes a X/Y translation element having micrometer driving heads with opposing return spring assemblies and an angular translation element having micrometer driving heads with opposing return spring assemblies. The substrate loading/unloading mechanism provides a workpiece from a plurality of workpieces onto a holder positioned at a first position within the reduced pressure atmosphere chamber, the first position being substantially parallel to a central axis of a flow of the filtered accelerated gas cluster particles. The substrate loading/unloading mechanism also moves the holder with a workpiece thereon to a second position, the second position being substantially perpendicular to the first position and the central axis of a flow of the filtered accelerated gas cluster particles.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
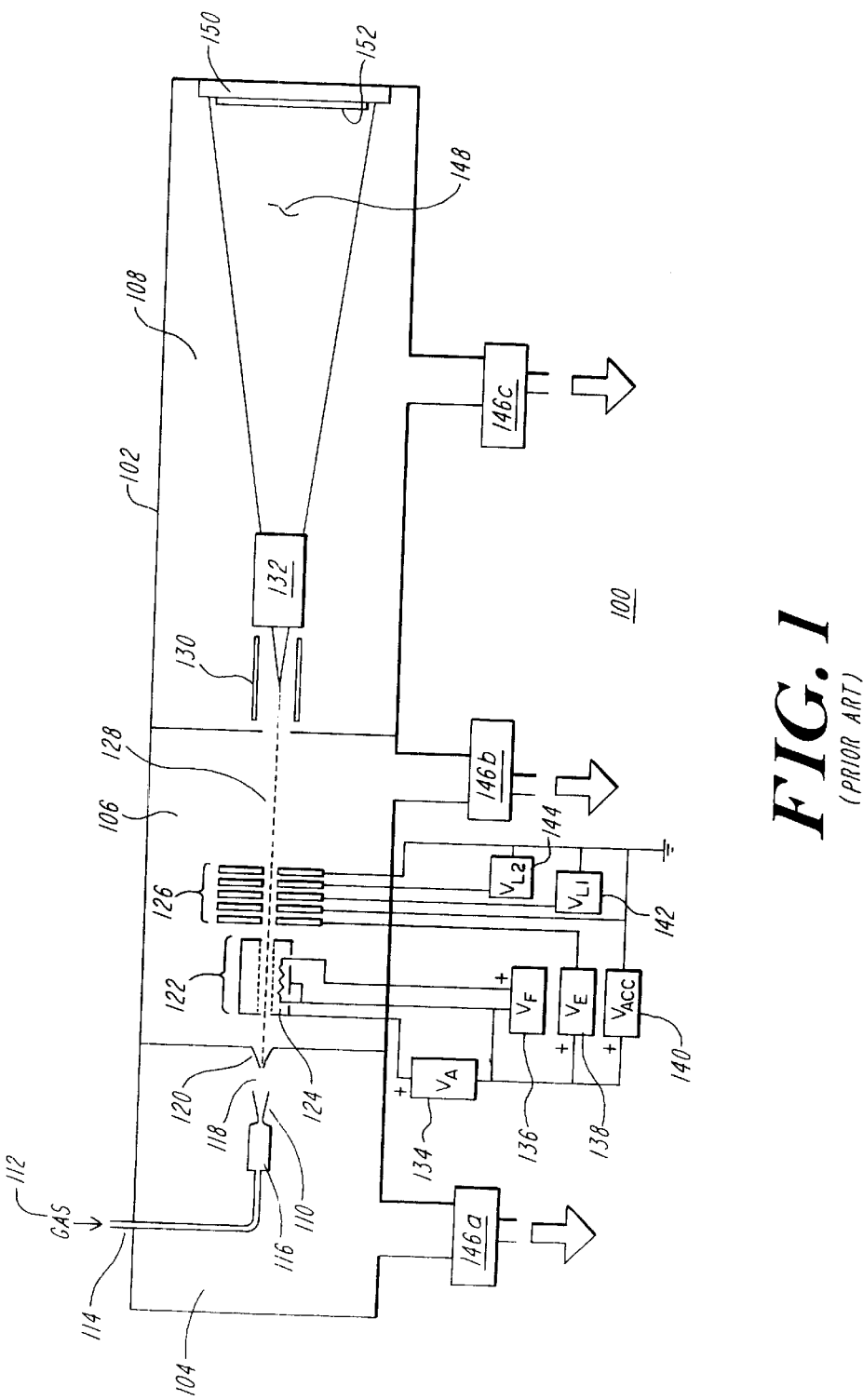
FIG. 1 shows the basic elements of a prior art GCIB processing system.

Gas cluster ions represent a technology with the potential for substantial improvements in surface-science processing and instrumentation. These gas cluster ions consist of a large number of gas atoms or molecules weakly bound by van der Waals forces and sharing a common electrostatic charge. Monomer and gas-cluster ion beams propagate within a vacuum where the beam energy is determined by its passage through an electrostatic acceleration field having a potential (voltage) difference. A cluster ion has a much larger mass and momentum than a monomer ion, but a much lower average energy per atom than does a monomer ion with the same total energy.

Gas clusters consisting of from tens to a few thousands of loosely bound atoms or molecules are formed by controlled adiabatic expansion of the source gas through a nozzle into high vacuum. After being ionized to carry a single positive charge, cluster ions are accelerated through potentials of between a few hundred volts and several tens of kilovolts. Under these conditions, the cluster ions have substantial total energies, but the energy is equally shared among the large number of loosely bound atoms or molecules that comprise each cluster and the energies of the individual atoms within the cluster ions are actually very small.

Impact of a gas cluster ion upon a solid surface produces a number of unique effects. The effects are associated with (i) the large total energy of the cluster; (ii) the small energies of the individual atoms within the cluster; and (iii) unusual atomic interaction phenomena which occur as the cluster disintegrates. Effects that are produced by the gas cluster ions have great potential for atomic scale processing of surfaces. Such gas clusters make possible improved surface sputtering and processing for many types of materials. For example, a gas cluster ion beam has a surface modification capability for etching and smoothing surfaces including gold, tantalum, and other metals, silicon (monocrystalline and polycrystalline), tantalum and other metals, silicon dioxide, sapphire and other dielectrics, as well as on other materials.

Typically, argon clusters are injected into vacuum, ionized, accelerated (1–30 kV), focused, magnetically filtered, and electrostatically scanned so as to impact a substrate's surface with near-normal incidence. Gas cluster ion beams have been found to simultaneously sputter etch and smooth surfaces (to roughness as low as 1–2 Å rms) without accumulating roughness or subsurface damage.

Gas clusters consist of a substantial number of weakly bound gas atoms or molecules. Clusters of atoms or molecules are held together by van der Waals forces formed by homogeneous condensation occurring within the supersonic flow of a gas expanding from a nozzle into vacuum. The condensation process occurs because the random thermal energy within the gas is converted into direct kinetic energy within the supersonic flow. The clusters can consist of from only a few atoms to many thousands of atoms, having size distributions determined by the source gas pressure and temperature conditions at the nozzle entrance and by the nozzle size and shape. Cluster beam sources also generate some fraction of monomer or molecular ions that in most cases must be filtered out of the beam.

Gases that are candidates for the generation of a gas cluster ion beam include Ar, $N_2$, $O_2$, $CO_2$, $N_2O$, $SF_6$, and some metalorganic materials Once formed, neutral gas clusters can be ionized and then subjected to acceleration potentials to produce directed beams of energetic gas cluster ions. Accelerated gas cluster ions can have high total energies in combination with very high total mass and momentum, but with low energies per constituent atom.

As noted above, the generation of gas cluster ion beams also produces unwanted monomer ions. It is desirable to separate out these monomer ions from the gas cluster ion beam. Since monomer (or in the case of molecular gases, molecular) ions as well as cluster ions are produced by presently available cluster ion beam sources, those monomer or molecular ions are accelerated and transported to the workpiece being processed along with the cluster ions.

Monomers or molecules, having high energy with low mass, results in high velocities, which allow the light monomers to penetrate the surface and produce deep or sub-surface damage. This is likely to be detrimental to the process. Not only monomers or molecules, having high energy with low mass, can produce a wide variety of deep damage, the monomers or molecules, having high energy with low mass, also cause implantation of the beam ions below the surface.

Conventionally, electrostatic and electromagnetic mass analyzers have been employed to remove light ions from the beam of heavier clusters. Conventional electrostatic and electromagnetic mass analyzers have also been employed to select ion clusters having a narrow range of ion masses from a beam containing a wider distribution of masses.

Currently, gas cluster ion beam sources produce a broad distribution of ion cluster sizes with limited cluster ion currents available. Therefore, it is not practical to perform gas cluster ion beam processing by selecting a single cluster size or a narrow range of cluster sizes—the available fluence of such a beam is too low for productive processing. It is preferred to eliminate only the monomer or molecular ions and other lowest mass ions from the beam and use all remaining heavier ions for processing.

To address this problem with conventional gas cluster ion beam apparatus, the present invention utilizes a permanent magnet that provides a magnetic field appropriate for separating monomer ions from a gas cluster ion beam.

In prior art, an electromagnetic beam filter has been used to separate ion masses. Electromagnets are costly, and while in use, electromagnets continually consume electrical power. Furthermore, the electrical power is converted to heat. Since the electromagnetic beam filter must be deployed in a vacuum chamber, convection cooling of the electromagnetic beam filter is not practical. Generally, conductive paths for water or other fluid cooling systems must be provided, and heat exchangers are required to remove heat from the cooling fluid and transfer it to the environment. Such cooling apparatus adds additional cost and introduces maintenance problems. Thus, the use of an electromagnetic beam filter is undesirable for these and other reasons.

Since effective gas cluster ion beam processing can be done at energies of 30 keV and lower, and because the monomer ions are typically of relatively low mass, for example AMU 40 for argon, powerful magnetic B fields are not required to effectively separate the monomer ions from the gas cluster ion beam. Furthermore, since it is acceptable to remove other higher mass (N<100) clusters from the gas cluster ion beam, it is practical to use a fixed magnetic B field. Therefore, a permanent magnet can be used effectively and very economically compared to an electromagnet.

Figure 6:
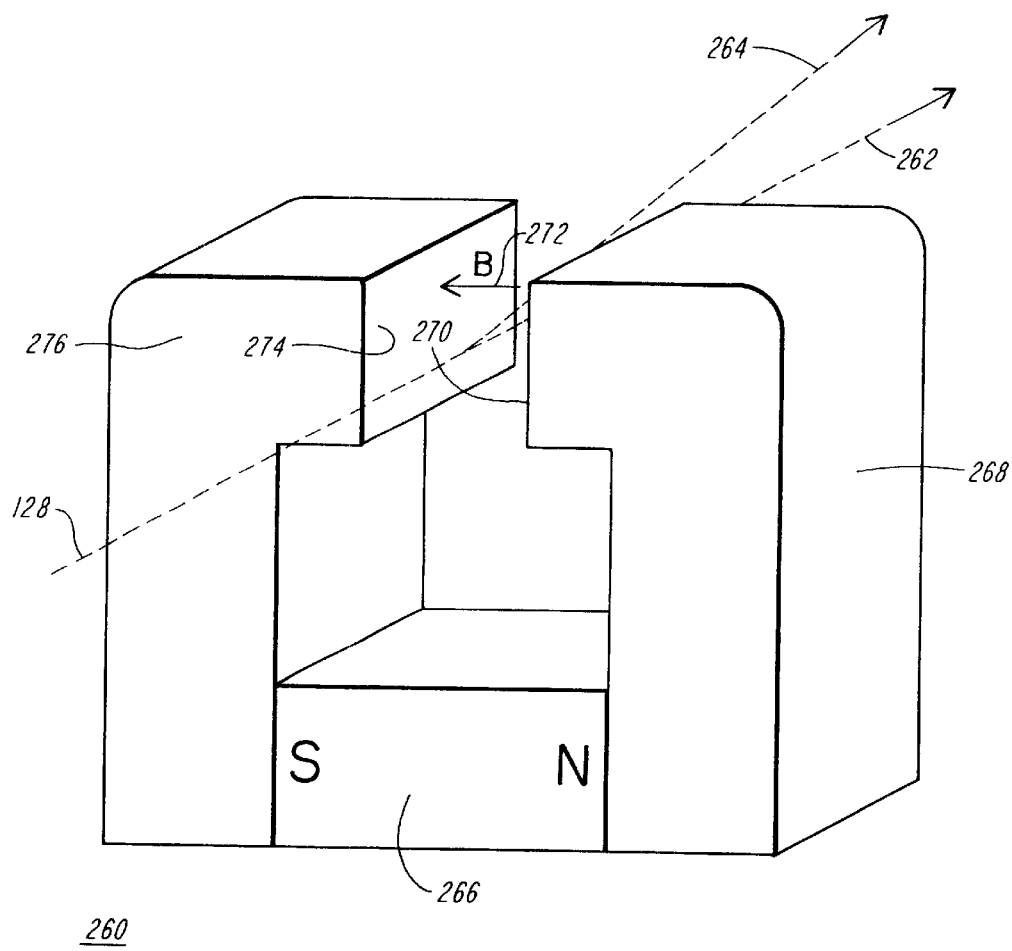
FIG. 6 shows a permanent dipole magnet for separation of monomer ions or molecular ions from a gas cluster ion beam according to the concepts of the present invention.

FIG. 6 shows detail of a permanent magnet beam filter 260 according to the concepts of the present invention. Specifically, in FIG. 6, permanent magnet beam filter 260 consists of permanent magnet 266 having north (N) and south (S) poles. Iron pole pieces 268 and 276 are attached to permanent magnet 266 forming a magnetic circuit having two pole faces 270 and 274 separated by a gap, having within it a magnetic B-field 272 signified by an arrow and the symbol B. Pole face 270 is the north pole face and pole face 274 is the south pole face.

The permanent magnet beam filter 260 is disposed such that the gas cluster ion beam 128 initial trajectory is directed centrally through the gap between pole faces 270 and 274. Light monomer or molecular ions in the gas cluster ion beam are deflected along trajectory 264, and the heavy cluster ions continue substantially unperturbed along trajectory 262 which differs negligibly from the initial trajectory of gas cluster ion beam 128.

Figure 7:
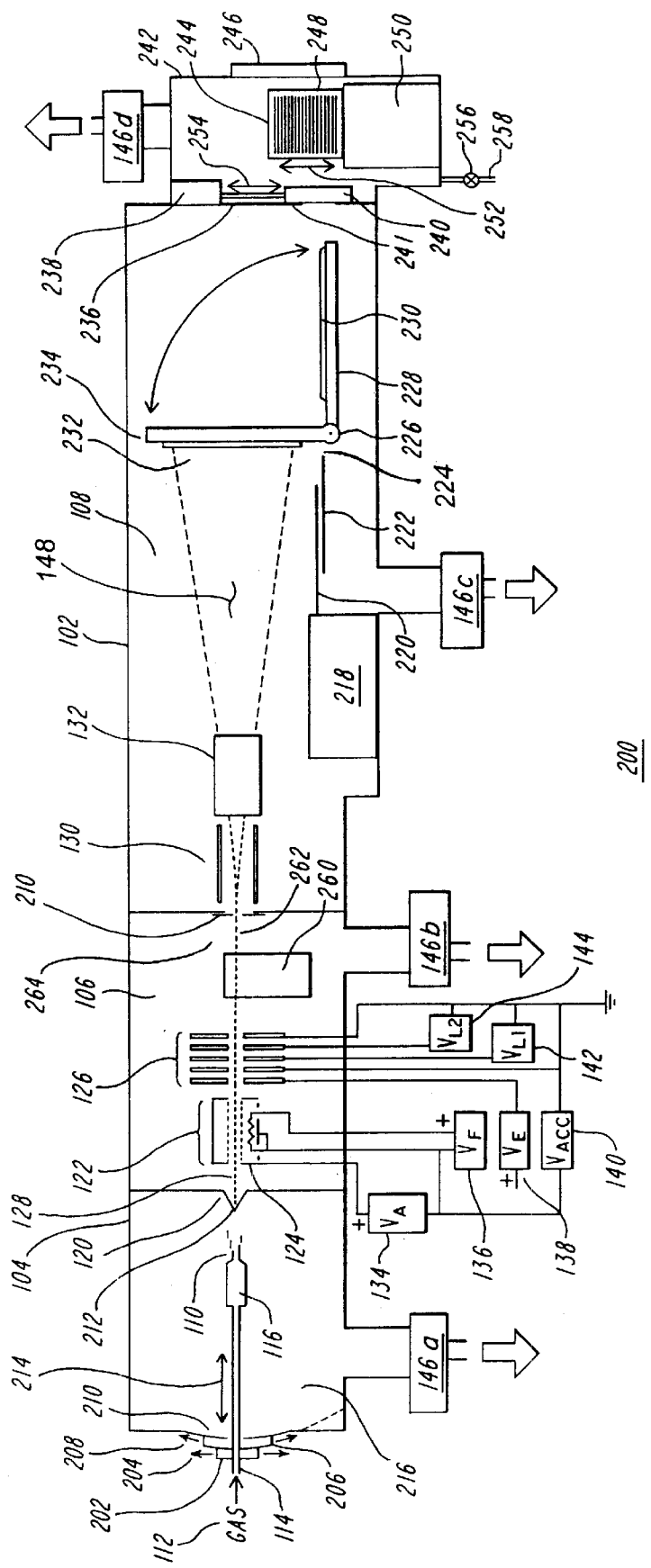
FIG. 7 is a schematic of a gas cluster ion beam processing system according to the concepts of the present invention.

FIG. 7 shows a gas cluster ion beam apparatus, according to the concepts of the present invention, having such a magnetic beam filter 260. The magnetic beam filter 260 is disposed in a location to receive the gas cluster ion beam 128 after beam formation by high voltage electrodes 126 and before beam scanning at electrostatic scan plates 130 and 132. The gas cluster ion beam 128 containing unwanted monomer ions passes through a magnetic B field between pole faces of permanent magnet assembly 260, where the lighter monomer ions are deflected away from the initial trajectory of gas cluster ion beam 128. The light monomer ions follow deflected trajectory 264, while the heavy cluster ions are negligibly perturbed and follow trajectory 262, which is substantially the same as the initial trajectory of gas cluster ion beam 128. The unwanted monomer ions following deflected trajectory 264 strike mass analysis plate 210, which has an aperture to permit passage of the heavy cluster ions following trajectory 262.

Another problem with conventional gas cluster ion beam apparatus is application to a production environment. More specifically, conventional gas cluster ion beam processing systems have been laboratory and research systems equipped with single wafer processing systems that required manual loading and unloading of workpieces before and after processing.

To address this problem, the present invention, the gas cluster ion beam processor of the present invention serially processes multiple workpieces sequentially. Each wafer is held gently at the edges using pins. During the gas cluster ion beam process, the workpiece is stationary, and the beam is scanned in a raster pattern over the workpiece. Uniform gas cluster ion beam processing is achieved through beam controls and focusing. The total cluster dose at the surface is measured by collecting and integrating the total beam current on the processed area over time.

A workpiece holder 234, as illustrated in FIG. 7, holds a workpiece 232 in the path of the scanned gas cluster ion beam 148 for processing. The workpiece holder 234 rotates about an axis 226 by means of a rotary actuator (not shown), moving it from a processing position to a load/unload position. The workpiece holder in the load/unload position is represented by designator 228. The workpiece on the workpiece holder in the load/unload position is represented by designator 230.

Workpieces 244 to be processed are held in a cassette 248 standing on an elevator platform 250 inside a vacuum load lock 242 attached to processing chamber 108. Between load lock 242 and processing chamber 108, there is a lock door 240, actuated in a linear direction 254 by actuator 238. When closed, lock door 240 seals processing chamber 108 with o-ring seal 241. When the lock door 240 is open, workpieces 244 may be transferred through the lock door 240 opening to workpiece holder 228. Workpiece transfer actuator 218 is operable to move transfer arm 220, having an end effector 224, in a linear motion 222 to transfer workpiece 230 to workpiece cassette 248 through door opening 240. Similarly transfer actuator 218 can move workpieces from workpiece cassette 248 to workpiece holder 228.

The cassette 248 is placed into or removed from the load lock 242 through a door 246. The load lock 242 may be evacuated using vacuum pumping system 146d and may be vented to atmospheric pressure through vent line 258 by means of vent valve 256. The endstation evacuation and venting; the cassette elevator 250; the load lock door actuator 238; the workpiece rotary actuator 22; and the workpiece transfer actuator 218 are all controlled and sequenced by a control system.

The loading and unloading of workpieces is accomplished in sequence so as to present each wafer in a horizontal position at the workpiece holder when in the load/unload position or in the cassette. In this way, workpieces can be loaded and unloaded using industry standard robotics in conjunction with vacuum load locks containing cassette elevators. The robotics load the wafer into a horizontal position in the end station. The rotating workpiece holder is rotated to vertical, providing for the workpiece to face the gas cluster ion beam.

The gas cluster ion beams is initially generated in a source chamber 104 of FIG. 7. The source chamber 104, in the preferred embodiment of the present invention, is maintained at $10^{-3}$ torr at a nominal source gas flow of 10 liters/second. This is realized by using a pump mouth conductance diameter of approximately 10 inches. This parameter determines the minimum overall chamber size. This is important, since the gas feed assembly, containing the nozzle at its downstream tip, is supported at the upstream most end. Thus, the larger the pump, the larger the chamber and the longer the moment arm of the nozzle assembly. This is a critical parameter in the design of the gas feed assembly and its alignment device because any vibration or sag in the gas feed assembly and its alignment device will cause a misalignment with the gas skimmer and consequently diminish the output or non-performance of the overall system. Moreover, it is necessary to make this assembly robust and stable, but still maintain flexibility to provide the required three-axis adjustment plus the angular correction necessary to offset any eccentricity produced in the forming of the nozzle itself.

The shape of the nozzle and the dimensional requirements of the extremely small throat diameter to long length ratio as well as the length of the expansion section preclude fabrication by conventional machining techniques. Conventional nozzles are made of glass through a process of iterative drawing and measuring procedures that create some slight piece to piece performance irregularities. Typical of these is the tendency of the core stream of gas to exit the nozzle at a slightly off axis angle creating the need for a corrective adjustment in the system alignment. Two schemes have been employed in conventional systems in an attempt to correct for this problem.

Figure 2A:
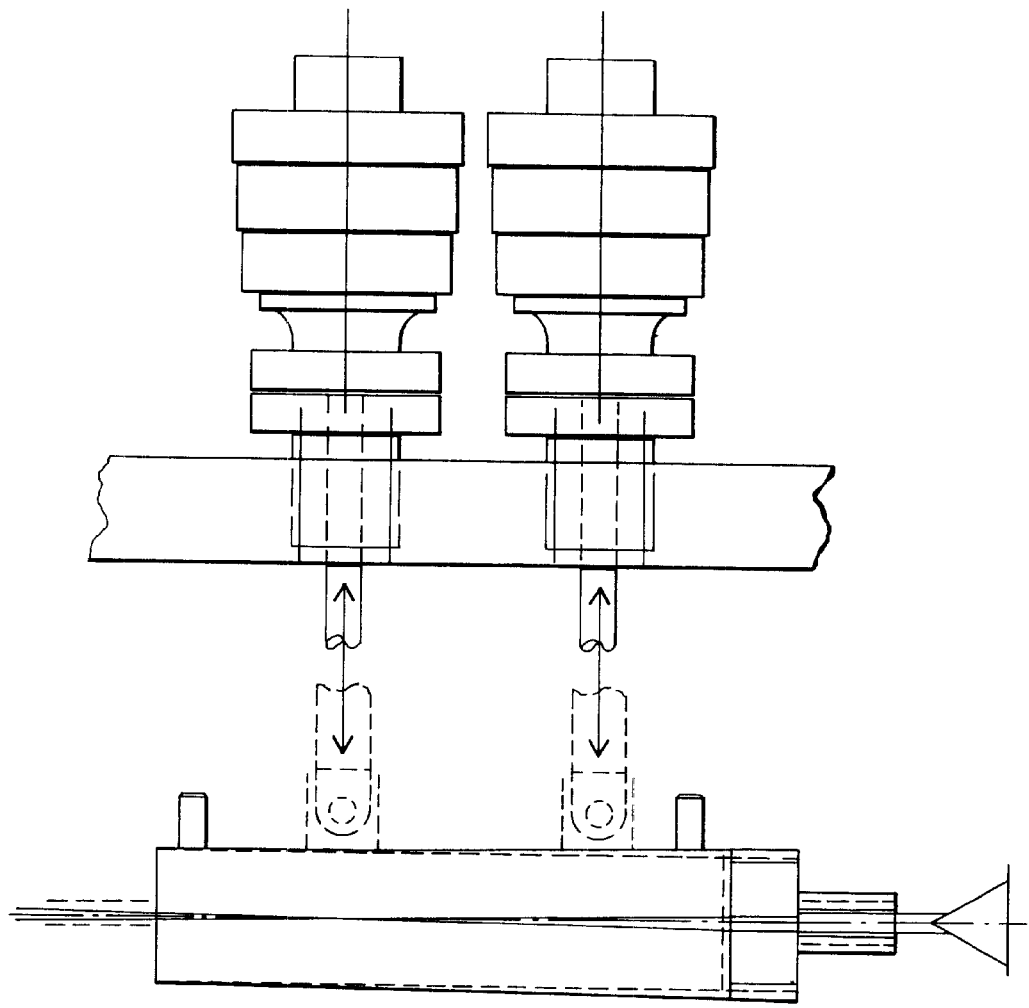
FIG. 2a is a representation of a prior art method of adjusting the vertical angular alignment of a gas nozzle.

In the first conventional gas cluster ion beam system, the gas feed assembly; consisting of gas feed tube, stagnation chamber, and nozzle; is suspended from a slip plate on two vertically adjustable rods. The rods are attached to and driven up and down by a pair of micrometer heads providing vertical (Y) translation and angular adjustment. The center of rotation of the adjustment is somewhere between the two adjusting posts causing translation of the nozzle tip with each angular adjustment and requiring (Y) correction. This is illustrated in FIG. 2a.

Figure 2B:
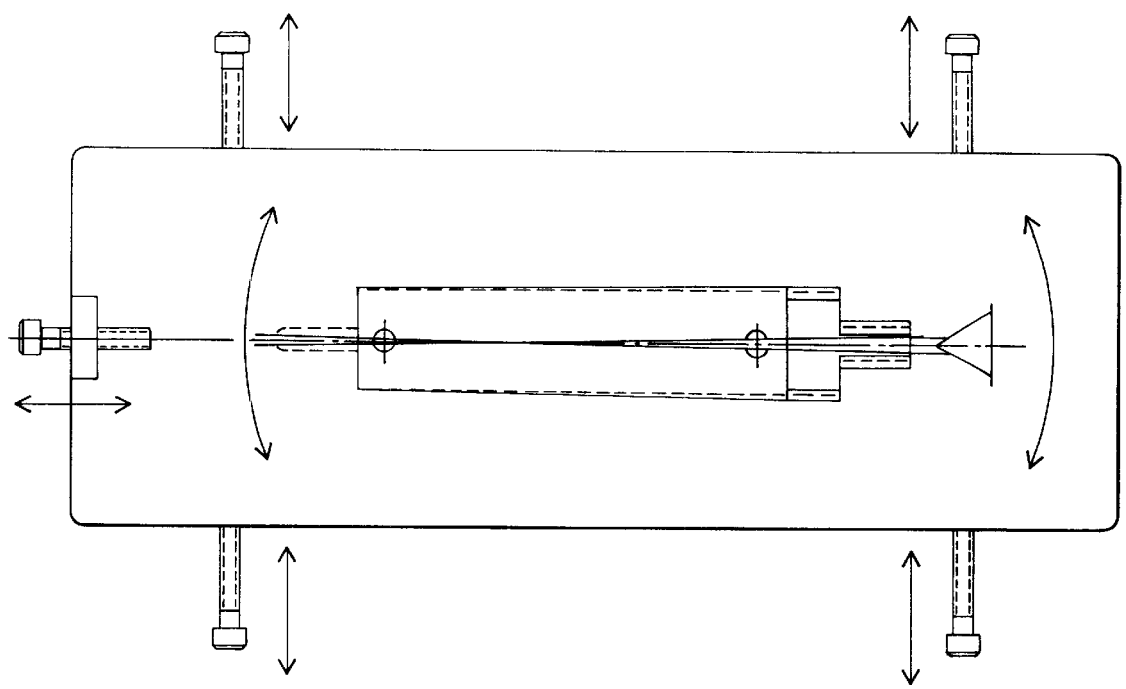
FIG. 2b is a representation of a prior art method of adjusting the horizontal angular alignment of a gas nozzle.

The slip plate, which is clamped on the outside of the top chamber plate with a Teflon plate and O-ring seal in between, is driven forward and back by a couple of opposed fine thread adjusting screws providing the "Z" axis adjustment. Likewise a pair of similar opposed couples mounted at each side near the front and rear of the slide plate allow horizontal (X) translation and angular adjustment. Again angular adjustment causes a shift of the nozzle tip requiring (X) correction as illustrated in FIG. 2b.

This system, while simple in concept, is difficult to align. It can be made to work, but entails a long series of angular adjustments and translations and is seldom accurately repeatable. It also poses a potentially troublesome vacuum sealing problem.

Figure 3:
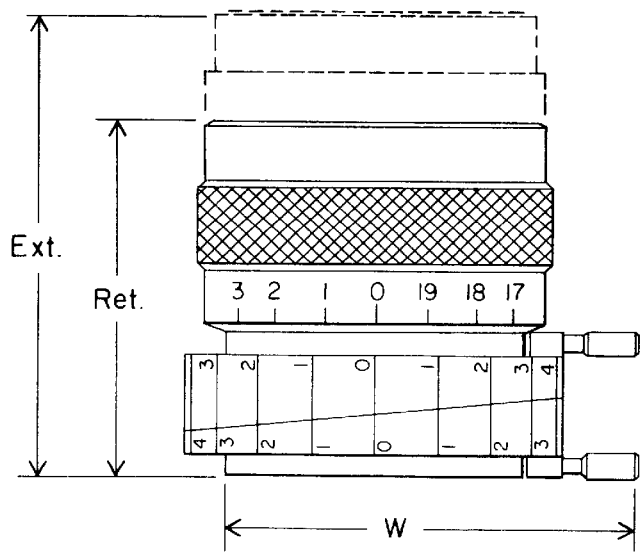
FIG. 3 is a representation of two prior art commercially available alignment devices for X and Y axis alignment, which have been used to align a gas nozzle.

Another conventional nozzle assembly utilizes two commercially available alignment devices. In this case, angular adjustment is provided by a system of counter rotating circular wedges wherein the center of rotation is at the interface of the wedges hence each angular adjustment causes a translation of the nozzle tip, as illustrated in FIG. 3. The translation of the nozzle tip must then be corrected with the X/Y translators.

Translation in the horizontal (X) and vertical (Y) directions is done with two simple micrometer head driven translation stages coupled to a bellows sealed translation stage which provides (Z) adjustment.

Figure 4:
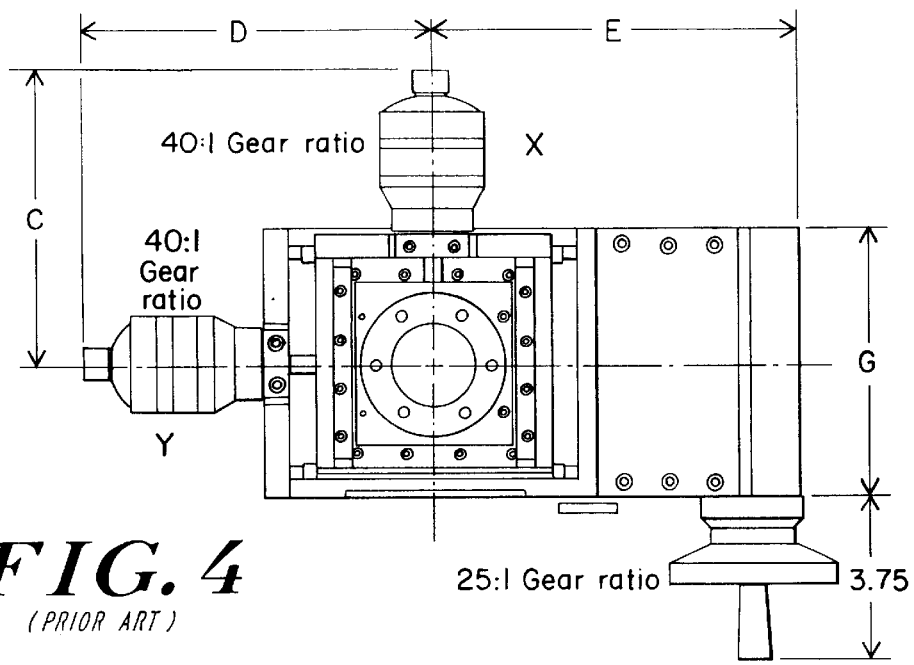
FIG. 4 is a representation of a prior art commercially available alignment device for X and Y axis alignment, which has been used to align a gas nozzle.
Figure 5:
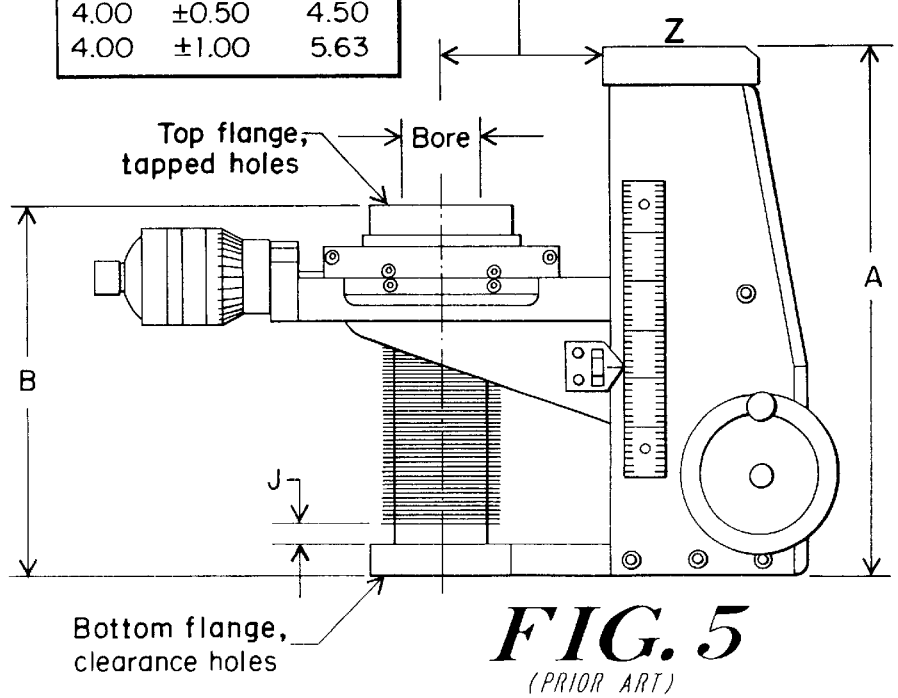
FIG. 5 is a representation of a prior art commercially available alignment device for Z (longitudinal) axis positioning, which has been used to position a gas nozzle.

Further conventional system is shown in FIGS. 4 and 5. This system uses commercially available micrometer mechanisms for alignment in three orthogonal axes, but it also has the same drawback of many iterative steps in order to achieve usable alignment. Due to the design of the rotating wedge assembly, the rotational alignment must be done under vacuum and must be redone completely whenever the system is vented since this assembly relaxes, that is sags, under atmospheric conditions. This system is very large and heavy, and is expensive. Also, the bellows-sealing concept, though widely used, is subject to damage in this application.

All these conventional devices fail to provide consistent repeatable beam alignment. Moreover, these conventional devices fail to deal conveniently and effectively with the fact that the nozzle may also have angular misalignment with the skimmer aperture.

The present invention provides a nozzle assembly that addresses these problems. More specifically, the present invention utilizes a modified Laval nozzle for adiabatic gas expansion into the system. Furthermore, the present invention utilizes a manipulator for aligning the nozzle with the gas skimmer aperture that incorporates x, y, z, $\theta_1$, and $\theta_2$ positioning capability.

Figure 8A:
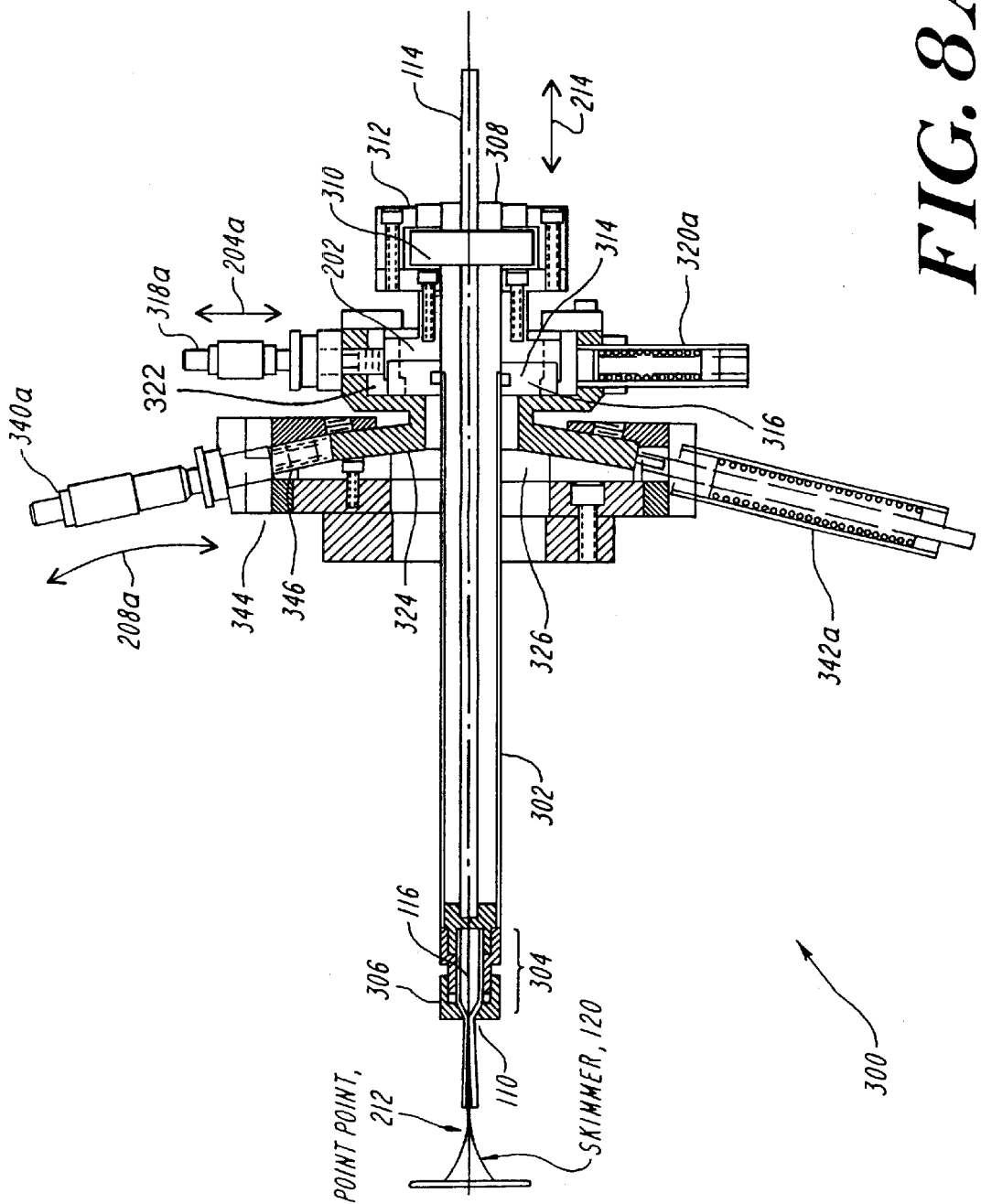
FIGS. 8a and 8b respectively show top and side views of the a nozzle/ gas skimmer alignment mechanism according to the concepts of the present invention.
Figure 8B:
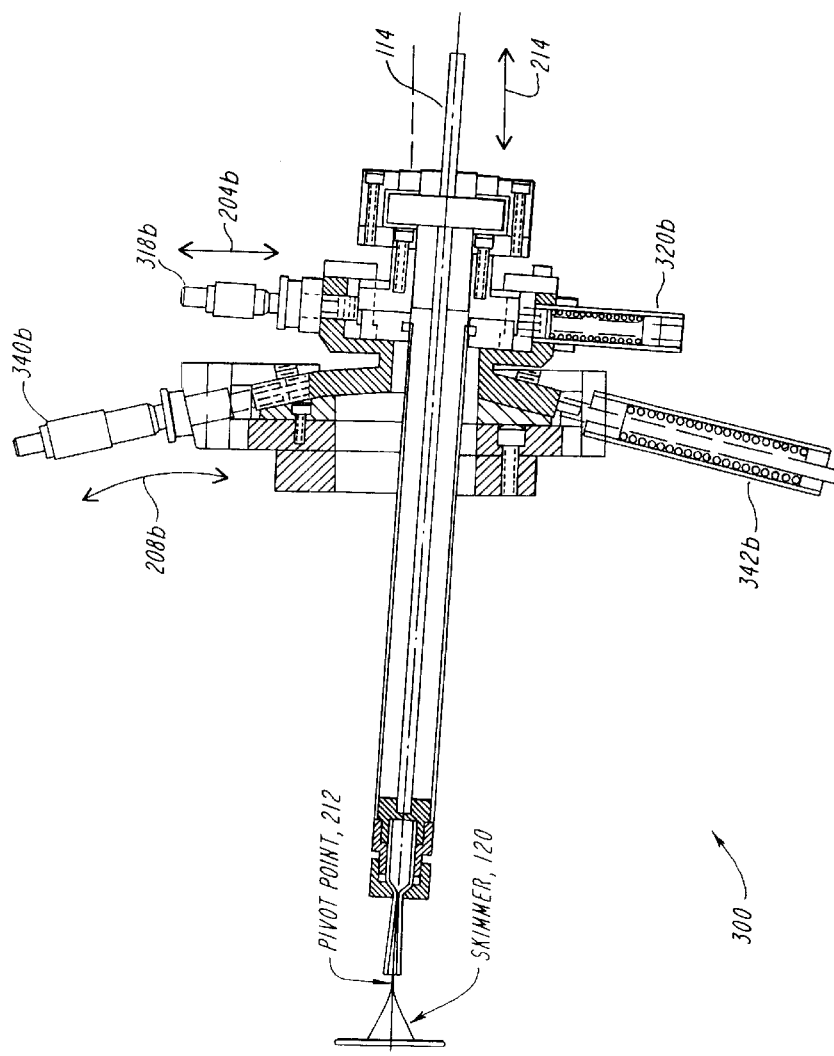

The nozzle/gas skimmer alignment device of the present invention is shown in FIGS. 8a and 8b, as well as in FIG. 7. In this system as illustrated in FIGS. 8a and 8b, there are basically three movable elements providing four degrees of adjustment. At the upstream end is the gas feed assembly consisting of an outer tubular body 302 containing the high pressure gas feed tube 114 at its center and the nozzle holder 304 at its downstream end. The gas feed tube 114 carries high pressure process gas 112 to a small cavity at the downstream end into which the body of the nozzle has been inserted.

The nozzle is sealed to this cavity with an O-ring piston seal and captured by a knurled retaining nut 306 against the nozzle shoulder. An additional O-ring is used to provide a resilient cushion between the nozzle shoulder and the inside surface of the retaining nut 306. This additional O-ring is not intended as a seal.

Welded to the exterior of the outer tubular body 302, near the inlet end, is a fine threaded collar 308 approximately five centimeters long. A knurled drive wheel 310 threaded onto this collar and captured by a yoke 312 fastened to the X/Y translation element 202 of the device acts to retain the gas feed assembly and to provide the required Z axis adjustment. Once the Z axis adjustment is completed it is locked in with a jamb nut against the drive wheel. The outer tubular body 302 of the gas feed assembly passes through a piston type O-ring seal 314 recessed into the sealing collar 316 of the X/Y translation element 202, providing the vacuum seal to the gas feed assembly.

The X/Y translation element 202 is the central portion of the device. In addition to providing the means for X and Y axis adjustment, it unites the other functions into a coordinated system. The body of this element houses the X/Y translator block 202 which in turn captures the sealing collar 316 and with it the gas feed assembly. Two micrometer driving heads 318a and 318b with opposing return spring assemblies 320a and 320b penetrate the horizontal and vertical sides of the body ninety degrees apart and bear on the translator block 202. The cavity 322 in the body has sufficient clearance to provide eight millimeters of motion either side of the center position in both X and Y directions when the micrometer plungers are adjusted.

The return spring force pushes the block in the opposite direction as the micrometer plunger is retracted. The downstream portion of the X/Y element body is a spherically shaped cup 324 into which the spherical block 326 of the angular adjuster sits and rotates. The radius of curvature 216 of this surface is equal to its distance from a pivot point 212 at the entrance aperture of the gas skimmer 120 when the throat of the nozzle 110 is five centimeters from the gas skimmer aperture. Thus, when a nozzle with an expansion cone length of 2–2.5 cm is used, the desired 2–3 cm free space between nozzle and gas skimmer is achieved.

More importantly, since the entrance aperture of the gas skimmer 120 is designed to be the center of rotation for the gas feed assembly, once the X and Y adjustments have been set such that the nozzle 110 exit aperture is lined up co-axially with the gas skimmer 120 entrance aperture, the entrance angle of the gas jet into the skimmer can be adjusted for maximum transmission by rotating the gas feed assembly about this pivot and by making $\theta_1$ and $\theta_2$ axis adjustments without requiring translational corrections. This eliminates the many iterative adjustments required by the conventional methods and provides a fast and easy optimization of system output.

$\theta_1$ and $\theta_2$ rotational axis adjustments are made similarly to the X and Y axis adjustments. Two micrometer driving heads 340a and 340b with opposing return spring assemblies 342a and 342b penetrate the horizontal and vertical sides of the body 344 ninety degrees apart and bear on the cup 324. The cavity 346 in the body has sufficient clearance to permit rotary motion either side of the center position in both $\theta_1$ and $\theta_2$ directions when the micrometer plungers are adjusted. The return spring force pushes the block in the opposite angular direction as the micrometer plunger is retracted.

In one embodiment of the present invention, the outside bearing surfaces of both the X/Y translator block element and the angular translator block element as well as the ID of both housing bodies are circular. However, the circular design causes a potential problem.

Figure 9A:
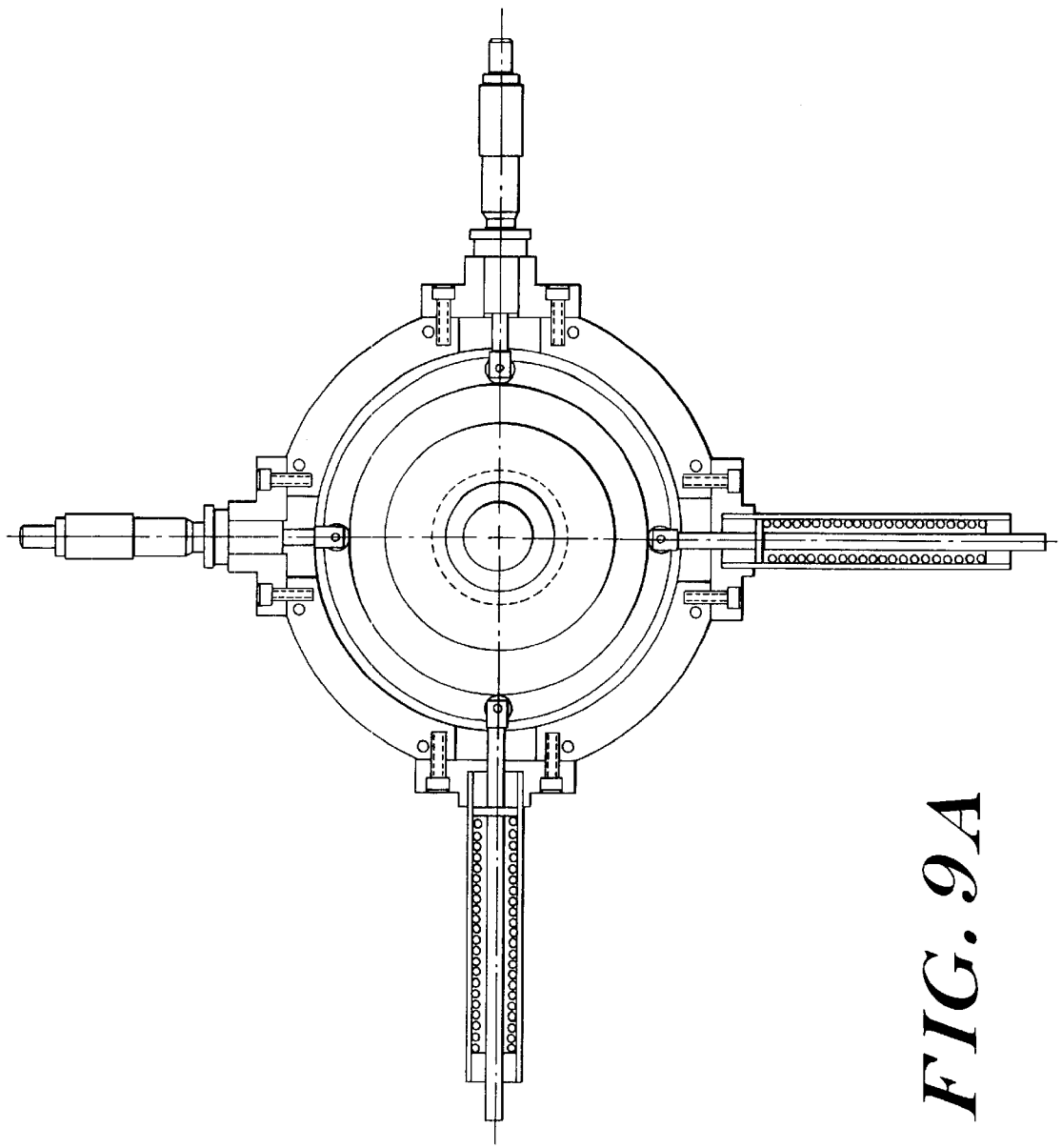
FIGS. 9a and 9b respectively show centered and off-centered positions of the X/Y adjustments in an alignment mechanism having circular translator blocks according to the concepts of the present invention.
Figure 9B:
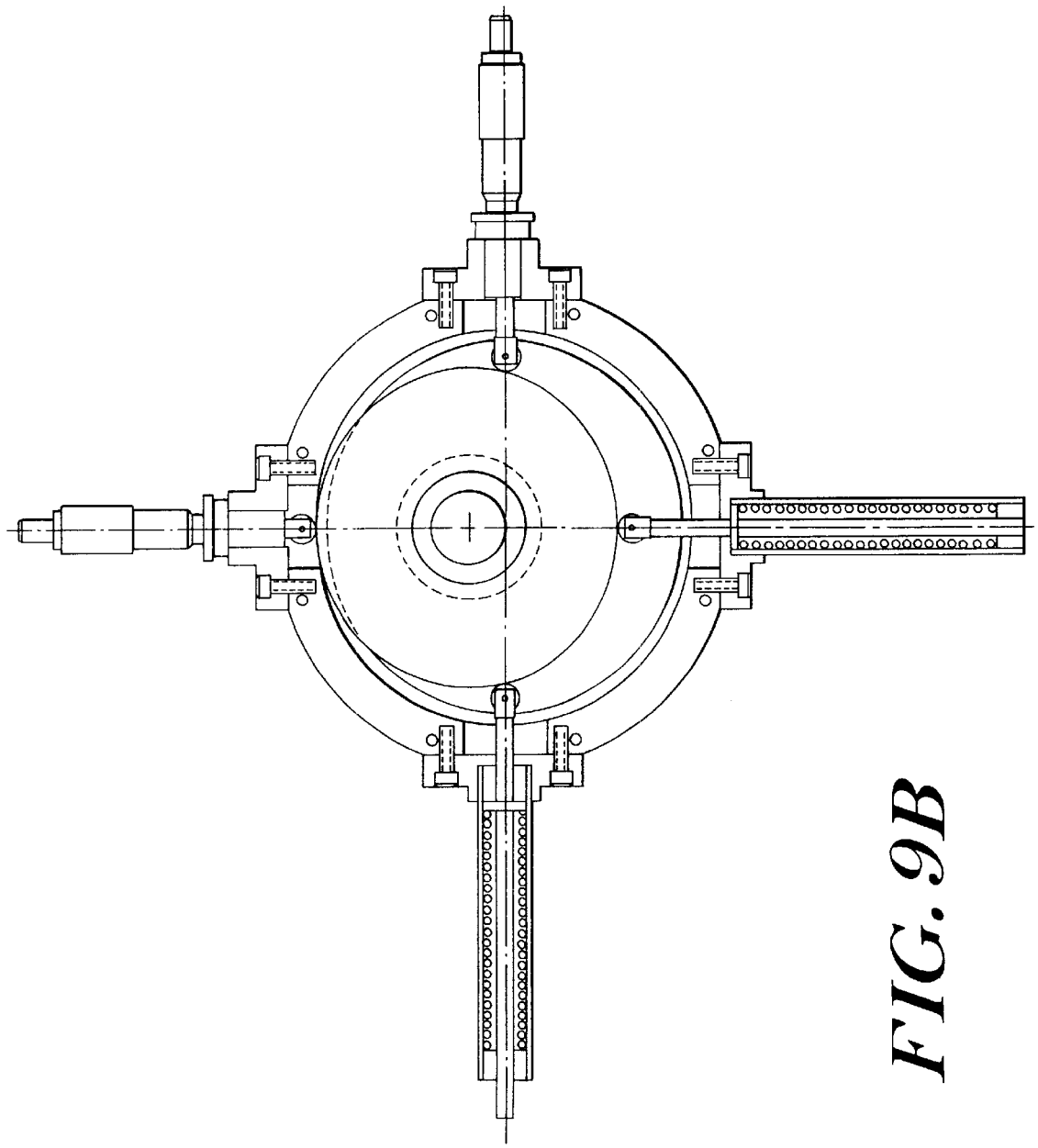

For example, with respect to the circular designed elements, in the neutral or zero position all the elements of the system are centered mechanically with the moveable segment of each element centered in its corresponding housing, (body). In this state, the micrometer driving heads and their opposing return plungers are in mid position, each half extended, as shown in FIG. 9a. If the moveable element is then pushed off center with the micrometer driver in one axis, and then in the other axis, as shown in FIG. 9b, the movement causes the micrometer driver in the first case to travel along the circumference of the moveable element and off the radial axis. This allows the micrometer driver to move back toward its original position under the spring force 10 causing misalignment in the first axis. This is true in all directions in both the θ and X/Y adjustments.

Figure 10A:
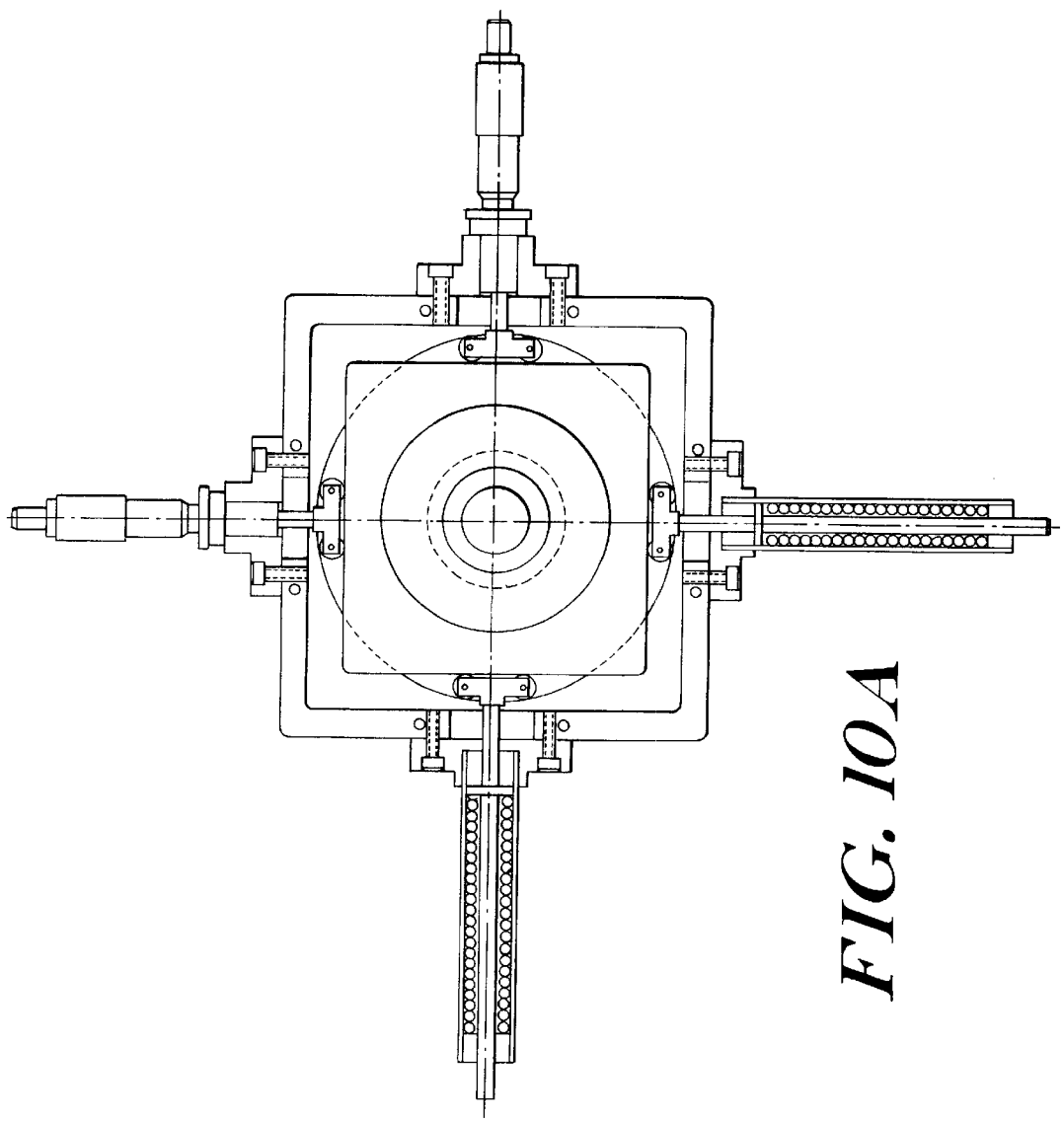
FIGS. 10a and 10b respectively show centered and off-centered positions of the X/Y adjustments in a preferred embodiment of an alignment mechanism having square translator blocks according to the concepts of the present invention.
Figure 10B:
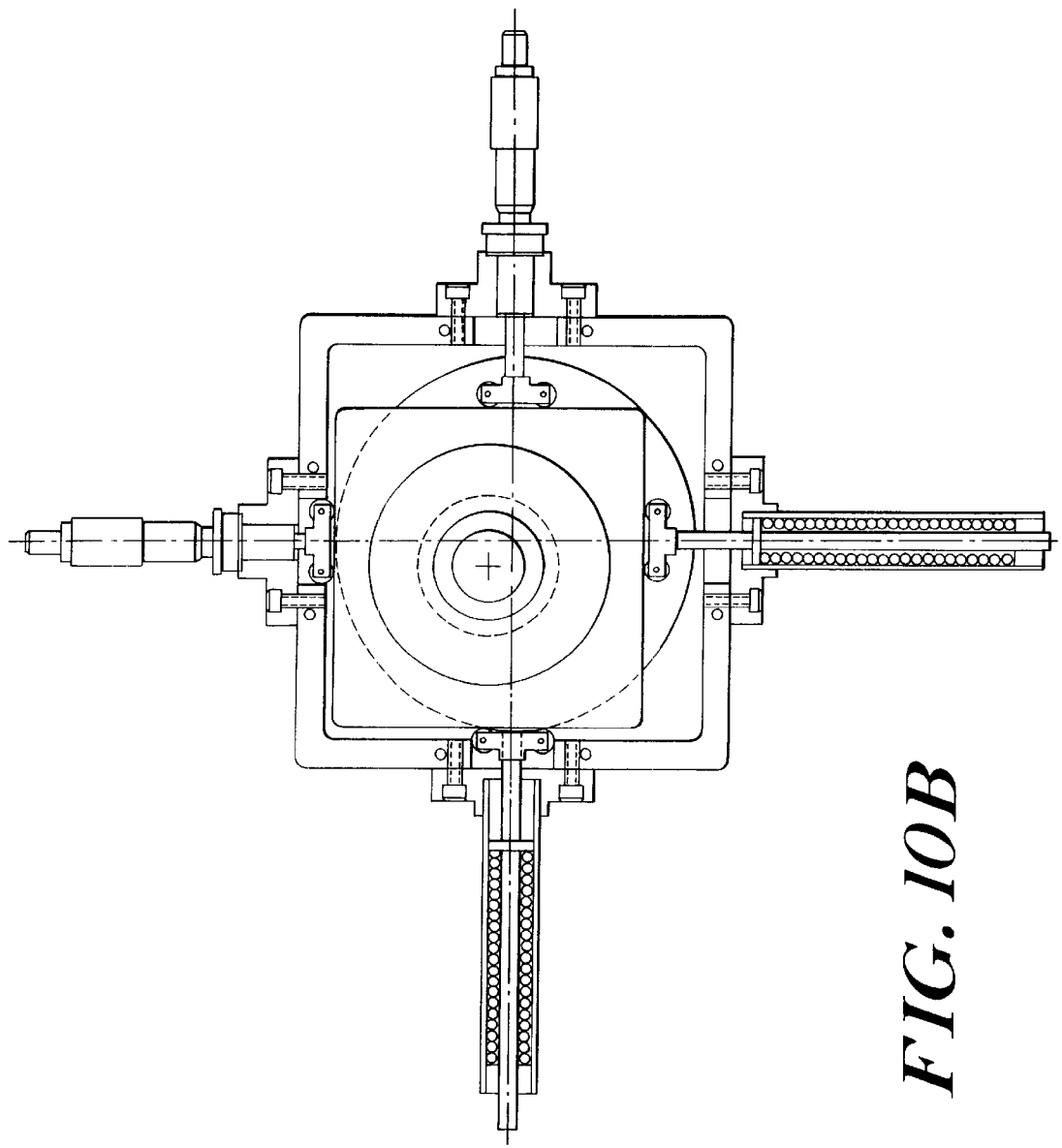

To correct this potential problem, another embodiment of the present invention provides that the outside bearing surfaces are square or parallel to the direction of travel. This allows the element to be free to move in one axis completely independent of the other. The use of roller tipped drivers and return springs allows the element to move smoothly in one axis while being held firmly in the other. This second embodiment is shown in FIGS. 10a and 10b. This second embodiment of the alignment portion of the present invention prevents occurrence of the "over-center" condition that results in jamming or binding of the system when it has circular translator blocks.

The alignment portion of the present invention provides accurate and repeatable alignment; adjustments that are fast, simple, and intuitive; a compact and light weight device, yet robust and able to resist misalignment due to vibration; and vacuum interface components highly high vacuum compatibility.

Optimal efficiency is achieved by forming the largest possible fraction of the process gas into a directed beam of large clusters and transporting it through the gas skimmer into the ionization section.

As noted above, the beam generation and transport system of the present invention is shown schematically in FIG. 7. The gas cluster ion beam apparatus 200 consists of an electron impact ionization source 122 with multiple filaments; an ion beam focusing system comprised of the lens portion of high voltage electrodes 126; a monomer or molecular filter magnet 260; electrostatic scanner system consisting of orthogonally disposed pairs of scan plates 130 and 132; and an end station with robotic handling capability. An acceleration power supply 140 biases the ionizer positively with respect to ground by an acceleration voltage $V_{Acc}$, which establishes the total acceleration which is imparted to the gas cluster ion beam 128. In the preferred embodiment of the present invention, the new gas cluster ion beam apparatus 200 employs a larger end station process chamber with a 3700 liter/sec diffusion pump comprising a portion of pumping system 146c.

The gas cluster ion beam processor 200 uses an electron impact ionizer 122 having multiple filaments 124. The ionizer 122 operates to produce up to 100 nA of (Ar, O, C, N, etc.) ion clusters. The ionization source is a hot filament electron impact having "linear-filament" geometry. There are three parallel linear filaments stretched between two endplates that serve as mechanical supports and electrical connections for the filaments. The three filaments are parallel to the beam path and disposed in a cylindrical pattern around the beam.

The source extraction electrode has an adjustable extraction voltage applied by extraction power supply 138, and is biased negative with respect to the ionizer 122 potential.

The gas cluster ion beam apparatus 200 employs a triode/Einzel lens combination as part of the high voltage electrodes 126 in order to achieve a uniquely long focal length (up to 1.5 meters) that enables a small beam spot size at the workpiece target. The lens consists of three electrodes connected to, respectively, a first lens power supply 142 providing lens voltage $V_{L1}$, a second lens power supply 144 providing lens voltage $V_{L2}$, and ground. Operating pressure inside the beam line with full beam power is $\sim 3 \times 10^{-6}$ torr, leading to excellent beam transmission.

The ion beam scanning device of the gas cluster ion beam apparatus 200 is a conventional device. Two pairs of orthogonally oriented electrostatic scan plates 130 and 132 are used to scan the beam in an X/Y raster pattern. X and Y scan frequencies are approximately 1 kHz and are chosen to give an interlaced scan pattern of fine pitch. The scanned gas cluster ion beam 148 has a conical envelope.

Figure 11:
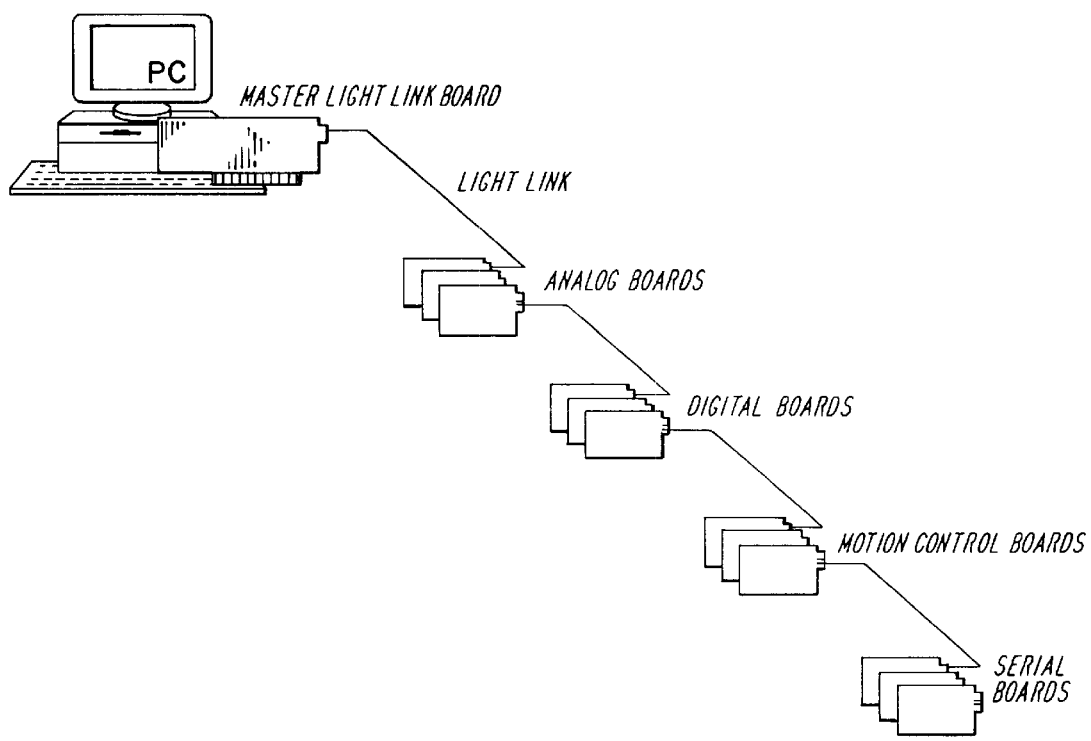
FIG. 11 shows the elements and communication structure of the control system of a gas cluster ion beam processing system according to the concepts of the present invention.

The gas cluster ion beam apparatus includes a control system consisting of, in the preferred embodiment, a single PC, a master light link board, and several control boards, as illustrated in FIG. 11. Control boards are available for digital, analog, serial, and motion control. The boards can be strung together in any order and in any combination. Fiber optic cables connect the boards together, thereby eliminating problems associated with electrical interference and makes the control system suitable for high voltage applications.

Conventional control systems consist of software, hardware and electronics. However, with respect to the conventional systems, the various components are usually purchased from several sources. Thus, software conflicts between vendors, mismatches between hardware boards, firmware and embedded operating systems are problems that often plaque the conventional control systems. The present invention provides a control system that includes software as well as the electronics.

One advantage of the present invention is the User Programmability ("UP") feature of the software that allows the user of the equipment to modify the behavior of the software and the machine directly from the user interface. This shortens the turnaround cycle of trying something new from days, in the traditional software development cycle, to minutes. The aspect of the UP that enables this advantage is called the sequence editor.

The sequence editor is a syntax smart script editor that creates or modifies script files known as sequences. When editing a sequence, the editor only presents valid choices to the user. An example: if the user wants to open a valve, simply click on 'Add Line', Select the 'Open Valve {}' statement and the user will be presented with a list existing valves from which to choose. This syntax smart editor prevents entering erroneous statements into the sequences. The sequence language controls give the user access to all I/O operations, timeouts, flow logic, interlocks and other services needed to fully define the machine's behavior.

One important aspect of the sequence editor is the 'single step' feature. This allows the user to execute a single line inside a sequence. The user simply highlights the desired line and clicks on the 'step' button. The feature is extremely useful when trouble shooting I/O points. To check if a relay is defined and wired properly, simply add two statements to a sequence: 'turn on {}' and 'turn off {}' (where {} is the I/O point in question). The step function allows the user to turn on and off the I/O point. No new software is needed and no user interface changes have to be made to accomplish this, which again shortens the debug cycle needed to checkout and verify a machine.

In the preferred embodiment, common board components are used. Moreover, the light link front end of all boards is identical. In the preferred embodiment, the microcontroller that runs on the boards is an 87C52 processor.

The software that runs on the microcontroller is identical on all boards. This eliminates the problems with incorrect chips being used on the wrong type board. The main software is Forth based, running on top of DOS.

Through the use of common components, field service and trouble shooting tasks on the present invention are greatly reduced, leading to higher uptime on the machine.

The gas cluster ion beam apparatus of the present invention provides greater gas cluster ion beam production quality as well as an increase in workpiece throughput. The precise control of beam parameters has led to improved performance characteristics. The higher beam currents, combined with the automation of wafer handling and system control, has directly increased the throughput of the gas cluster ion beam system.

What is claimed is:

1. A substrate surface treatment method, comprising the steps of:
   (a) forming a beam comprising gas cluster particles comprising a plurality of atoms or molecules, said beam further comprising gas monomers;
   (b) ionizing the gas cluster particles and gas monomers;
   (c) accelerating the gas cluster particles and gas monomers;
   (d) filtering accelerated gas cluster particles and gas monomers to remove the accelerated gas monomers using a permanent magnet beam filter; and
   (e) irradiating the accelerated magnetically filtered gas cluster particles onto a surface of a substrate in a reduced pressure atmosphere.

2. The method as claimed in claim 1, wherein the permanent magnet beam filter includes a permanent magnet having north and south poles, iron pole pieces attached to the permanent magnet to form a magnetic circuit having two pole faces separated by a gap between which the ionized gas cluster particles flow.

3. The method as claimed in claim 1, wherein the filtering step further removes accelerated low mass gas cluster particles.

4. A substrate surface treatment apparatus, comprising:
   a nozzle to form a beam comprising gas cluster particles comprising a plurality of atoms or molecules, said beam further comprising gas monomers;
   an ionizer to ionize said gas cluster particles and gas monomers;
   a power supply to accelerate the gas cluster particles and gas monomers;
   a permanent magnet beam filter to remove accelerated gas monomers from said beam; and
   scanning means for irradiating the magnetically filtered accelerated gas cluster particles onto a surface of a substrate in a reduced pressure atmosphere.

5. The apparatus as claimed in claim 4, wherein said permanent magnet beam filter includes a permanent magnet having north and south poles, iron pole pieces attached to the permanent magnet to form a magnetic circuit having two pole faces separated by a gap between which the gas cluster particles flow.

6. The apparatus as claimed in claim 4, wherein the permanent magnet beam filter further removes accelerated low mass gas cluster particles.

7. A substrate surface treatment method, comprising the steps of:
   (a) forming a beam comprising gas cluster particles comprising a plurality of atoms or molecules, said beam further comprising gas monomers;
   (b) accelerating the gas cluster particles and gas monomers;
   (c) focussing the accelerated gas cluster particles and gas monomers using a lens combination to realize a long focal length;
   (d) filtering the focussed gas cluster particles and gas monomers to remove the monomers using a permanent magnet beam filter; and
   (e) irradiating the accelerated magnetically filtered gas cluster particles onto a surface of a substrate in a reduced pressure atmosphere.

8. The method as claimed in claim 7, wherein the lens combination is a triode/Einzel lens combination.

9. The method as claimed in claim 8, wherein the focal length is less than 1.5 meters.

10. The method as claimed in claim 7, wherein the permanent magnet beam filter includes a permanent magnet having north and south poles, iron pole pieces attached to the permanent magnet to form a magnetic circuit having two pole faces separated by a gap between which the gas cluster particles flow.

11. A substrate surface treatment apparatus, comprising:
   a nozzle to form a beam comprising gas cluster particles comprising a plurality of atoms or molecules, said beam further comprising gas monomers;
   an ionizer to ionize said gas cluster particles comprising a plurality of atoms or molecules and said gas monomers;
   a power supply to accelerate the gas cluster particles and the gas monomers;
   a lens combination to focus the accelerated gas cluster particles and the gas monomers to realize a long focal length;
   a permanent magnet beam filter to filter the gas monomers from the gas cluster particles within the focussed beam; and
   scanning means for irradiating the magnetically filtered accelerated gas cluster particles onto a surface of a substrate in a reduced pressure atmosphere.

12. The apparatus as claimed in claim 11, wherein the lens combination is a triode/Einzel lens combination.

13. The apparatus as claimed in claim 11, wherein said permanent magnet beam filter includes a permanent magnet having north and south poles, iron pole pieces attached to the permanent magnet to form a magnetic circuit having two pole faces separated by a gap between which the gas cluster particles flow.

14. An apparatus for treating a surface of a substrate, comprising:
   a nozzle to form a beam comprising gas cluster particles comprising a plurality of atoms or molecules, said beam further comprising gas monomers;
   an ionizer to ionize the gas cluster particles and gas monomers;
   a power supply to accelerate the gas cluster particles and gas monomers;
   a lens assembly to focus the accelerated gas cluster particles and gas monomers;
   a filter to remove the gas monomers from the gas cluster particles;
   scanning means for irradiating the filtered accelerated gas cluster particles onto a surface of a workpiece situated in a reduced pressure atmosphere chamber; and
   a substrate loading/unloading mechanism to load and unload the workpiece;
   said substrate loading/unloading mechanism providing a workpiece from a plurality of workpieces onto a holder positioned at a first position within the reduced pressure atmosphere chamber, said first position being substantially parallel to a central axis of a flow of the filtered accelerated gas cluster particles;
   said substrate loading/unloading mechanism moving the holder with a workpiece thereon to a second position, said second position being substantially perpendicular to said first position and the central axis of a flow of the filtered accelerated gas cluster particles.

15. The apparatus as claimed in claim 14, wherein said filter includes a permanent magnet having north and south poles, iron pole pieces attached to the permanent magnet to form a magnetic circuit having two pole faces separated by a gap between which the gas cluster particles flow.

16. An apparatus for treating a surface of a substrate, comprising:
   a nozzle to form a beam comprising gas cluster particles comprising a plurality of atoms or molecules;
   a skimmer for removing undesired gas molecules from the beam, said skimmer having an entrance aperture through which said beam passes;
   an ionizer to ionize said gas cluster particles;
   a power supply to accelerate the gas cluster particles; and
   scanning means for irradiating the accelerated gas cluster particles onto a surface of a workpiece situated in a reduced pressure atmosphere chamber;
   said nozzle including an alignment device;
   said alignment device including,
      a X/Y translation element, and
      an angular translation element,
      wherein the angular translation element has a pivot point at the entrance aperture of the skimmer and is capable of providing angular adjustment through rotation about the pivot point without corresponding adjustments to the X/Y translational element.

17. The apparatus as claimed in claim 16, further comprising a permanent magnet beam filter for removing low mass particles from said beam.

18. The apparatus as claimed in claim 17, wherein said permanent magnet beam filter includes a permanent magnet having north and south poles, iron pole pieces attached to the permanent magnet to form a magnetic circuit having two pole faces separated by a gap between which the gas cluster particles flow.

19. The apparatus as claimed in claim 16, further comprising a lens assembly to focus the accelerated gas cluster particles.

20. The apparatus as claimed in claim 16, further comprising a substrate loading/unloading mechanism to load and unload the workpiece, wherein said substrate loading/unloading mechanism provides a workpiece from a plurality of workpieces onto a holder positioned at a first position within the reduced pressure atmosphere chamber, said first position being substantially parallel to a central axis of a flow of the accelerated gas cluster particles; and
   said substrate loading/unloading mechanism moves the holder with a workpiece thereon to a second position, said second position being substantially perpendicular to said first position and the central axis of a flow of the accelerated gas cluster particles.

21. An apparatus for smoothing a surface of a substrate, comprising:
   a nozzle to form gas cluster particles comprising a plurality of atoms or molecules;
   an Ionizer to ionize said gas cluster particles;
   a power supply to accelerate the gas cluster particles;
   a triode/Einzel lens combination assembly to focus the accelerated gas cluster particles;
   a permanent magnet beam filter to filter the focussed gas cluster particles;
   scanning means for irradiating the filtered accelerated gas cluster particles onto a surface of a workpiece situated in a reduced pressure atmosphere chamber; and
   a substrate loading/unloading mechanism to load and unload the workpiece;
   said nozzle including an alignment device;
   said alignment device including,
   a X/Y translation element having micrometer driving heads with opposing return spring assemblies, and
   an angular translation element having micrometer driving heads with opposing return spring assemblies;
   said substrate loading/unloading mechanism providing a workpiece from a plurality of workpieces onto a holder positioned at a first position within the reduced pressure atmosphere chamber, said first position being substantially parallel to a central axis of a flow of the filtered accelerated gas cluster particles;
   said substrate loading/unloading mechanism moving the holder with a workpiece thereon to a second position, said second position being substantially perpendicular to said first position and the central axis of a flow of the filtered accelerated gas cluster particles.

* * * * *